SILICON SEMICONDUCTOR DEVICES AND PROCESSES FOR MAKING THEM

Filed Aug. 1, 1955

WITNESSES:

Wm. C. Groome

James F. Young

INVENTOR
Ezekiel F. Losco.
BY
Frederick Shapoe
ATTORNEY

United States Patent Office 2,801,375

Patented July 30, 1957

2,801,375

SILICON SEMICONDUCTOR DEVICES AND PROCESSES FOR MAKING THEM

Ezekiel F. Losco, Whitehall, Pa., assignor to Westinghouse Electric Corporation, East Pittsburgh, Pa., a corporation of Pennsylvania Application August 1, 1955, Serial No. 525,595

9 Claims. (Cl. 317—234)

This invention relates to semiconductor devices and in particular to silicon semiconductor rectifiers of the P–N junction type which are specially adapted for power purposes.

It has long been desirable to provide semiconductor devices comprising a member of silicon provided with at least one P–N junction. When alternating electrical current is applied to one side of the P–N junction, rectification takes place since the junction has low impedance to current flow from the P-type to the N-type areas but very high impedance to current flow from the N-type to the P-type areas of the silicon member.

The outstanding advantages of the silicon P–N junction material is that it has a high rectifier efficiency at all temperatures up to about 220° C. Germanium rectifiers on the other hand become quite inefficient at temperatures approaching 100° C. As a consequence rectifiers prepared from germanium must be cooled with great care in order to prevent the temperatures from exceeding a certain predetermined maximum, ordinarily about 80° C. High capacity silicon diode rectifiers on the other hand can be adequately air-cooled by conducting heat therefrom to simple fins or other radiator of moderate size. As a consequence, silicon rectifiers may be safely employed under conditions where the ambient temperatures are extremely high or where, because of the heavy loads, it would be difficult to maintain temperatures of the rectifiers below 100° C.

The preparation of P–N junction semiconductor devices from silicon requires the solution of many difficult problems. The silicon material itself must be employed in the form of extremely thin wafers whose thickness is of the order of 10 mils (0.010 inch). The silicon wafers are quite brittle and fragile so that they will break or shatter if subjected to any appreciable mechanical stresses. Breakage may be encountered not only during the manufacture and assembly of the rectifiers but also during use by reason of differential thermal expansion that takes place between the wafer of silicon and an end contact to which it is affixed, as the rectifier device embodying them heats up in use.

One of the critical problems in preparing satisfactory rectifiers from silicon semiconductor materials is to dissipate rapidly and efficiently the heat developed during use. While silicon has the ability to rectify electrical current at elevated temperatures of up to 220° C., the most efficient rectification takes place at lower temperaures. Therefore, the lowest possible operating temperatures should be maintained. Excessive temperatures, beginning at about 220° C., may impair operation of the rectifier devices and even cause failure of the rectifier if it is subjected to heavy electrical loads while at such elevated temperatures. The silicon wafer must be mounted on an end contact of a highly heat conducting metal such as molybdenum, and a solder must be employed to assure good thermal and electrical contact. The terms "solder" and "soldering" are used in the broadest sense to include brazing metals and brazing.

Other problems involved in producing satisfactory rectifying devices relate to the protection of the silicon wafers from adverse atmospheres and contamination. Since for silicon conductor applications the silicon should be of the higest order of purity, ordinarily having less than one part by weight of impurity per 10 million parts of silicon; moisture, small particles of dirt, and the like settling on the silicon can react or diffuse into the silicon wafer and result in damage or impairment of its efficiency in rectification.

In order to produce satisfactory silicon diode semiconductor units, it is necessary to bond the silicon to the molybdenum or other end contacts with a solder that should have the following properties:

1. Wet and bond to silicon both while in the molten state and in the solidified state.

2. Wet and bond to molybdenum, tungsten and base alloys thereof, both while in the molten and solidified state.

3. Have low electrical and thermal resistance.

4. Have a suitable matching coefficient of thermal expansion and good ductility which will enable the solder to unite a silicon wafer to a molybdenum end contact over a temperature range of 925° C. to −100° C. without breaking away from or damaging the silicon.

5. Will not contaminate, adversely react with or otherwise impair the properties of the silicon wafer.

6. Low vapor pressure at elevated temperatures so that leakage paths are not produced during soldering and other high temperature operations.

7. Require no flux to secure a good metal-to-metal bond.

The object of this invention is to provide a semiconducting member comprising silicon bonded to a heat absorbing and dissipating contact member by means of a silver base solder composed of over 50% by weight of silver, a critical proportion of antimony, and the balance being at least one element of the group consisting of tin, silicon, germanium and lead.

A further object of the invention is to provide a process for uniting silicon wafers to contacts comprising molybdenum by means of a silver base solder containing from 0.5% to 8% by weight of antimony.

A still further object of the invention is to provide a process for producing semiconductor rectifier devices by first uniting at an elevated temperature one surface of a silicon wafer to an end contact of molybdenum or the like by the silver base solder containing selected amounts of antimony, and, second, bonding another contact of molybdenum or the like to another surface of the silicon by means of an aluminum solder member, the second bonding being conducted at a substantially lower temperature than the first.

Other objects of the invention will in part be obvious and will in part appear hereinafter.

For a better understanding of the nature and objects of the invention attention is directed to the accompanying drawing, in which.

Figure 1:
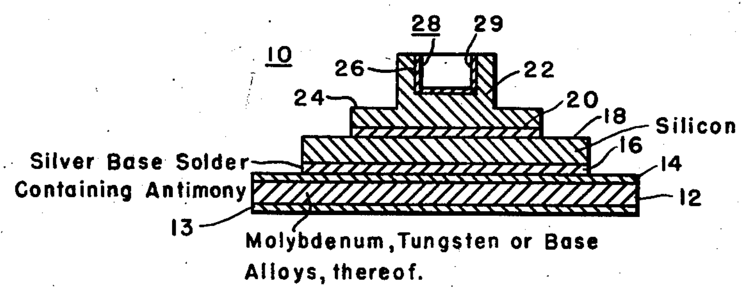
Figure 1 is a vertical cross section through a stacked assembly prior to fusion.

Briefly, I have discovered that it is possible to produce excellent semiconductor devices of the P-N junction type by bonding a silicon wafer to an end contact of molybdenum, tungsten or base alloys thereof by means of a silver base solder composed of from 0.5% to 8 by weight of antimony, up to 20% by weight of at least one element selected from the group consisting of silicon, germanium, lead and tin, and the balance (>72%) consisting of silver. The properly bonded silicon wafer is protected from damage over the widest ranges of fluctuations including cooling from about 1000° C. to room temperatures during the process of its fabrication, and usage from as low as −100° C. to 220° C. and higher. The silver base alloy solder enables heat developed in the silicon wafer during its use as a rectifier to be conducted efficiently and rapidly to the molybdenum end contact and thence to a suitable heat radiator. Furthermore, the silver base alloy meets all of the seven requirements set forth above. Other advantages of the silver antimony base solder will be set forth hereinafter.

More particularly, I have discovered that highly satisfactory and efficient silicon semiconductor devices may be prepared by employing as the solder or brazing alloy between the silicon and a molybdenum or other end contact an alloy comprising from 0.5% to 8% by weight of antimony, up to 20% by weight of at least one element selected from group IV of the periodic table and of the group consisting of silicon, germanium, lead and tin, and the balance silver. Examples of solders that have proven satisfactory are 95% silver, 5% antimony; 90% silver, 5% antimony, 5% tin; 93% silver, 5% germanium, 1% antimony, 1% silicon; 97.5% silver, 1.5% lead and 1% antimony; 94% silver, 5% lead, 1% antimony; 89% silver, 10% lead, 1% antimony; and 94% silver, 5% germanium, 1% antimony.

The silver base solder may include slight amounts of other elements and impurities providing that there is present no significant amount of a group III element or other component that will convert N-type silicon to P-type silicon.

Particularly satisfactory solders may be prepared by alloying 94% to 98% of silver, ½% to 2% of antimony and from 1% to 5% lead. These solders can be readily cold rolled into foil of 0.002 inch thickness.

When these silver base alloys are applied to the silicon wafer, some of the silicon from the wafer dissolves in the alloy and, consequently, solder in which there was no silicon prior to fusion will, after fusion and bonding, contain from 5 to 10% by weight of silicon.

The silver base solders are preferably employed in the form of thin films or foils of a thickness of from 1 to 6 mils though ordinarily there is no advantage in employing a silver solder exceeding 3 mils. However, the solder alloy need not be applied in film form. The silver base alloy may be prepared in a powder or granular form and a suitable thickness applied either dry or in the form of a paste in a volatile solvent, such as ethyl alcohol.

Reference should be made to Fig. 1 of the drawing where there is illustrated a stacked rectifier assembly 10 embodying the silver solder of the present invention. The stacked assembly is shown previous to introduction into a furnace where it will be heated to a sufficiently high temperature to fuse the silver base solder and other bonding components in preparing a unitary device.

The assembly 10 comprises an end contact 12 which may be of a substantial thickness of the order of 20 to 100 mils and from ¼ to 2 inches in diameter, and a silicon wafer 18. These dimensions may be even greater in the case of large rectifiers. The end contact comprises a metal selected from the group containing molybdenum and tungsten, or base alloys thereof. Both molybdenum and tungsten have a coefficient of linear thermal expansion corresponding closely to that of single crystal silicon (about $4.2\times10^{-6}$ per degree centigrade). Alloys of molybdenum and tungsten, for example an alloy composed of 5% tungsten and 95% molybdenum, also have nearly the same coefficient of thermal expansion as silicon. Both molybdenum and tungsten can be alloyed with minor amounts of other metals without greatly changing their coefficient of thermal expansion. Thus, molybdenum may be alloyed with 5% to 25% by weight of a platinum metal, for example osmium or platinum, chromium, nickel, cobalt, silicon, copper and silver. A coefficient of thermal expansion of between about 3.8 and $5\times10^{-6}$ per degree centigrade is satisfactory for cooperation with a silicon wafer. While both molybdenum and tungsten have excellent thermal conductivities so that they will carry away heat rapidly from silicon disposed in contact therewith, the molybdenum has a much lower density and for many applications it will be found preferable. Thus, in equipment which is subject to motion, members of the lighter molybdenum will have lower inertia effects than a similar size member of tungsten. Hereinafter, molybdenum will be specifically referred to, but it will be understood that tungsten or an alloy of either tungsten or molybdenum can be substituted therefor.

The molybdenum end contact 12 is carefully cleaned by abrading, etching and washing or any one such as abrading with a sand blast, to remove all surface contamination therefrom. In order to produce the best bonding, it has been found desirable to apply beforehand a thin coating 13 and 14 of silver or of an alloy of silver to both of the face surfaces of the contact 12. I have initially applied a coating 13 of silver solely to the lower surface. A satisfactory method of applying the silver is to coat the face surfaces with silver or an alloy comprising 95% silver and 5% germanium, either in the form of a thin sheet or fine powder, and heating the molybdenum so treated in a vacuum or a hydrogen atmosphere at 1200° C. The silver will rapidly wet the surface of the molybdenum and spread thereover uniformly. In other instances, I have first coated the molybdenum surfaces with a nickel phosphide coating following the procedure set forth in application Serial No. 301,016, assigned to the same assignee as the instant application. A coating of nickel phosphide is chemically deposited from an aqueous solution containing, for example, 0.2 mole/liter of nickel sulfate, 0.07 mole/liter of $NiCl_2$, and 0.225 mole/liter of sodium hypophosphite upon simply immersing the molybdenum members therein. After the members have been immersed for a period of time of the order of five minutes to 30 minutes they may be removed from the solution, dried and then heated to a temperature of 1200° C. for one-quarter of an hour or longer. A thin coating of nickel phosphide comprising 95% or more nickel, will cover the molybdenum surfaces, and it may then be silver plated in a conventional type of silver cyanide electroplating solution to apply approximately a coating of 1 mil thickness of silver 14.

It has been found that desirable results are secured if the molybdenum contact is coated with a thin coating of an alloy comprising from 10 to 35% by weight of cobalt, 33% to 22% by weight of nickel, and the balance being iron with small amounts of manganese and incidental impurities, such alloy being well-known by the trade name of Kovar. This nickel-cobalt iron alloy may be applied by rolling a sheet or bar of molybdenum with a thin surface strip of the alloy at an elevated temperature of the order of 500° to 1200° C. in an inert atmosphere or under vacuum. The Kovar type alloy need be of a thickness of only a few mils to be satisfactory. In some cases the latter has produced better results than are secured when the nickel phosphide coatings are used.

Upon the silver or nickel cobalt or on coating 14 there is placed a foil or film of the silver antimony base solder of the present invention.

The upper surface of the end contact 12 is illustrated as being flat as is the lower surface of the silicon wafer 18. However, it will be understood that while flat surfaced members are particularly convenient to prepare and employ, other shapes may be made and used. In all cases, it is necessary that the meeting surfaces of the end contact and the silicon wafer conform closely to one another so that a good silver alloy solder bond eventually results to provide for the best possible thermal conductivity.

The silicon wafer 18 will ordinarily be of a thickness of approximately 10 mils. Substantially greater thicknesses, such as 25 mils, for instance, result in less effective rectifier operation, while a substantially thinner silicon wafer, below 5 mils, for instance may be subjected to striking through or otherwise failing. The silicon wafer is prepared with finely polished or lapped surfaces which are etched in a solvent, such as the HF—$HNO_3$ and mercury solution set forth in Patent 2,705,192 to remove any surface impurity, loose particles, projections, roughness, and the like.

Upon the upper surface of the silicon wafer 18 there is placed a thin layer 20 comprising for example a foil of a thickness of from 1 to 2 mils of aluminum or an aluminum base alloy, and preferably an alloy of aluminum with an element from group III or IV, such, for example, as silicon, gallium, indium and germanium, which functions not only to enable soldering or bonding of the silicon wafer to an upper contact 22, but also produces P-type conductivity by diffusion into the upper portion of the N-type silicon wafer. The layer 20 may comprise pure aluminum with only slight amounts of impurities being present, such as magnesium, sodium, zinc, and the like, or an alloy composed of aluminum as a major component, the balance being silicon, gallium, indium, and germanium individually or any two or all of the latter being present. These alloys should be solid up to about 300° C. Thus, foils of 95% aluminum and 5% silicon; 88.4% aluminum—11.6% silicon; 90% aluminum—10% germanium; 47% aluminum—53% germanium; 88% aluminum—12% indium; 96% aluminum—4% by weight of indium; 50% aluminum—20% silicon—20% indium—10% germanium; 90% aluminum—5% silicon—5% indium; 85% aluminum—5% silicon—5% indium—5% germanium; and 88% aluminum—5% silicon—2% indium—3% germanium—2% gallium, may be employed (all parts being by weight). It is critical that the aluminum layer 20 be substantially smaller than the area of the silicon wafer 18, and that it be centered on the wafer 18 with a substantial clearance from the corners or edge of wafer 18. It is not necessary that the aluminum layer 20 be a foil or a separate layer. We have found it possible to vapor coat aluminum or the aluminum base alloy in a vacuum upon the lower surface of an upper contact 22. Alternatively, the selected central portions of the upper surface of the silicon wafer may be vapor coated with aluminum or aluminum base alloy, by masking the edges of the wafer.

The upper contact 22 is preferably composed of the same metal as the lower contact; namely, molybdenum, tungsten or base alloys thereof. The upper contact comprises a flat disc portion 24, which is smaller in area than the upper surface of the silicon wafer 18. The contact 22 comprises an upwardly extending button 26 provided with a cup or well 28 adapted to receive the end of a conductor. The upper contact 22 may be readily prepared from molybdenum by machining. We have found it desirable to coat only the well 28 of the contact 22 with a thin coating 29 of a suitable solder, such as 70% silver—30% gold alloys, 97% silver—3% germanium alloy, gold alone, or an alloy comprising 95% silver and 5% silicon or the nickel-phosphide coating previously described for the end contact. Care must be observed to prevent any silver being present at or near the edges of the disc portion 24 and aluminum layer 20 to avoid a short-circuit connection being produced.

The upper contact 22 may be of a simpler construction than shown in Fig. 1. Thus, round discs may be punched from a 30 mil to 50 mil thick sheet of molybdenum, than the round discs are counterbored to a depth of from 15 to 25 mils, to produce a cup or well which well is then coated with a solder, such as 95% silver—5% germanium alloy.

It will be understood that the upper contact need not have a cup or well, though such cup is advantageous for soldering of a conductor thereto. The upper contact can be of any suitable shape or structure which will enable firm bonding of a conductor thereto as by soldering and will be satisfactory.

Figure 2:
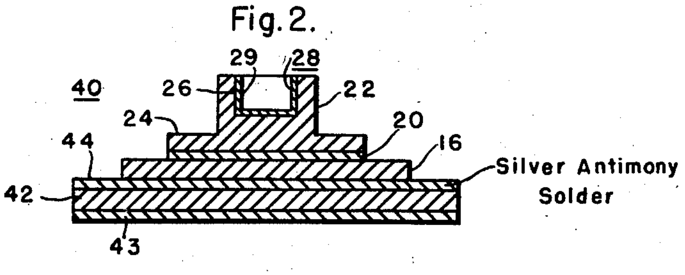
Fig. 2 is a vertical cross section through a modified form of stacked assembly.

The number of parts in the assembly may be reduced by resorting to the arrangement shown in Fig. 2 of the drawing. The assembly 40 in Fig. 2 comprises an end contact 42 of molybdenum on which there is applied to lower surface 43 a coating of the nickel-cobalt-iron alloy known as Kovar or silver or nickel phosphide. The upper surface of the end contact 42 is provided with a coating 44 of a thickness of from 1 to 6 mils of the silver antimony of the present invention either in the form of a foil or a powder. The remainder of the assembly, namely, the silicon wafer 16, the aluminum layer 20, and the upper contact 22, are similar to the arrangement illustrated in Fig. 1 of the drawing.

Figure 3:
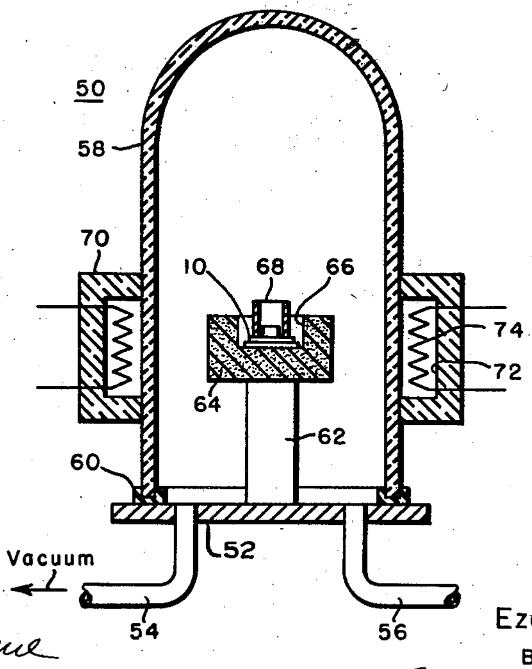
Fig. 3 is a vertical cross section through a vacuum furnace suitable for producing bonded silicon elements.

The assembly of Fig. 1 or 2 is then placed within a furnace 50, illustrated in Fig. 3 of the drawing. The furnace comprises a base 52 through which passes a conduit 54 connected with a pump or other source capable of producing a high vacuum and another conduit 56 for introducing a protective gas, such as helium, argon, or the like, and for breaking the vacuum which may be created in the furnace. The furnace proper comprises a bell 58 of a heat resisting glass, such as, for example, a 96% silica glass, fitting into a sealing gasket 60 applied to the base 52. A refractory support 62 mounted on the base 52 is adapted to support a graphite block 64 provided with one or more cavities 66 adapted to receive the assembly 10, such as shown in Fig. 1 of the drawing. A weight 68 of a high melting point non-reactive metal or other material, such as graphite, is applied upon the contact 22 of the assembly in order to apply a suitable light pressure to the assembly. An encircling heater 70 comprising a heating element 74 disposed within an annular groove 72 is adapted to be lowered about the bell 58 in order to heat the graphite block 64 by radiating heat thereto. Good results have been secured by using a high frequency heating coil in place of the heater 70 with heating element 74.

The weight 68 may range from approximately 20 grams to 500 grams per square inch of the silicon wafer surface being fused to the molybdenum end contact. Good results have been obtained by employing a weight of 5 grams for a one-quarter inch diameter silicon wafer. Up to 50 grams have been applied to one-quarter inch diameter silicon wafers with good results.

In practice, we have placed a number of assemblies 10 within the graphite block 64, placed the bell 58 thereover in position in the gasket 60 and evacuated the space within the bell 58 through the conduit 54. The gas pressure within the bell is reduced to an extremely low value of less than 0.01 micron. Heat is then radiated to the graphite block 64 by energizing the resistance heating element 74. Usually heating causes evolution of gases from the members and evacuation is continued throughout the operation. A thermocouple is placed within the depression 66 adjacent the assembly 10 in order to determine the temperature thereof.

The maximum temperatures necessary for satisfactory bonding of the assembly 10 have been from 850° C. to 1000° C. The aluminum or aluminum alloy layer 20 will not properly wet silicon and molybdenum until temperatures of at least about 570° C. are attained, and 800° C. is usually required for best results. Particularly good results have been obtained when the temperature of the furnace was controlled so that assembly 10 reached a peak of from 870° C. to 925° C. Such peak temperatures are held for a brief period of time, ordinarily not over a minute, and the temperature is then promptly reduced. No particular differences have been found in rectifiers wherein the rate of heating, and the corresponding rate of cooling, was varied to such an extent that the temperature rise from 100° C. to 875° C. took place in as short a time as 5 minutes or as long as 60 minutes. We have found that the silver solders of the present invention wet both silicon and molybdenum rapidly and dissolve a small amount of the silicon in a short while after they reach their melting point; holding for any prolonged time while the silver alloy is fused is possible, but does not produce any particularly beneficial results.

The upper surface of the N-type silicon wafer 18 is wetted by the molten aluminum layer 20 and the aluminum dissolves silicon as well as diffusing slightly into the N-type silicon wafer. On cooling the molten aluminum precipitates silicon upon the single crystal silicon wafer depositing silicon with aluminum present therein, producing a P-type layer of silicon contiguous with the aluminum which is of closely the same area as that of layer 20 at the upper surface. Therefore, a P-N junction results in the silicon.

The temperature required for the bonding of the silicon to the molybdenum end contact 12 is dependent of the fusion point of the silver solder 16. While some of the solders of the present invention have been found to melt as low as about 225° C., we prefer to employ solders whose melting point is at least 400° C. and preferably of the order of 600° C. to 700° C. Wetting of the silicon does not occur below about 570° C., and usually occurs at about 800° C. In no event is it desirable to employ any solder that requires a temperature of substantially over 925° C. to cause it to melt and wet. Temperatures appreciably above 1000° C. cause detrimental effects to take place so that unsatisfactory rectifiers are produced.

After the assembly 10, or the assembly 40, has been subjected to treatment in the furnace to cause fusion of the silver base solders with bonding of the components into a unitary diode or rectifier member, the resulting diode members are placed in a hermetically sealed metal casing. The end contact 12 is soldered to such metal casing by the coating 13 to enable heat to be conducted rapidly and efficiently to the casing. The metal casing is associated with an efficient radiator dissipating heat to the atmosphere. If desired, the casing can be partly or completely filled with an insulating dielectric liquid to assist heat dissipation. However, such dielectric liquid is not necessary.

In some cases, I have produced improved rectifiers by joining the assembly components in two stages. In carrying out the two-stage process, for example with the assembly of Fig. 1, only the end contact 12, the silicon wafer 18, and the intermediate layer of silver base solder 16 are placed in the graphite block 64 with the weight 68 applied thereto. The temperature of the furnace is controlled so that the temperature of these three components reaches a value of from 850° C. to 1000° C. Good wetting of the molybdenum and the silicon by the silver-antimony base solder is secured. The fused assembly is then cooled substantially below the temperature at which the silver base solder is fluid. For convenient handling the fused assembly is brought down to substantially room temperature. Then the aluminum member 20 is applied to the upper surface of the silicon wafer 18 and the upper contact 24 is applied thereupon. The assembly is then replaced in the graphite block 64, the weight 68 applied, and the furnace evacuated. The temperature of the furnace is controlled so that the assembly under the weight 68 is heated to a temperature of not exceeding 850° C. and then cooled to room temperature.

The following is an example of this last procedure. Upon a circular disc of molybdenum with a diameter of approximately 1 inch and of a thickness of about 50 mils there was placed a foil of approximately 9/32 inch diameter and of a thickness of 3 mils of an alloy of 95% silver and 5% antimony. Upon the silver solder there is then placed a silicon wafer of a diameter of one-quarter inch and of a thickness of 10 mils. These three components were then placed in an evacuated furnace and a pressure of 5 grams was applied. The assembly was heated to 1000° C. and cooled to room temperature. There was then placed on top of the silicon wafer a foil of aluminum of a diameter of approximately 5/32 inch and on it an end contact of molybdenum of the same diameter. The assembly was then reintroduced into the furnace, and a weight of 5 grams was applied. The assembly was then heated to 850° C., and when cooled to room temperature all of the rectifier units were found to be perfect and showed no cracks or other flaws.

In another case, rectifier units are made from molybdenum discs of a diameter of approximately 1 inch and of a thickness of 50 to 60 mils clad with 4 mils thickness of the Kovar alloy comprising 29% nickel, 17% cobalt and the balance substantially iron with a small amount of manganese. Upon the molybdenum disc was placed a foil of a diameter of 9/32 inch and of a thickness of 3 mils comprising 94% silver, 5% germanium and 1% antimony. Then a 10 mil thick silicon wafer of a diameter of one-quarter inch was centered on the silver alloy foil and then on top of the silicon wafer was placed a circular disc of approximately 0.2 inch diameter and of a thickness of 2 mils of 95% aluminum—5% silicon alloy, and topped with a molybdenum contact of the same diameter. The assembly was placed in a furnace with a weight of 5 grams thereon and heated to approximately 1000° C. for a few minutes and then cooled to room temperature in 30 minutes. This rectifier unit when tested had excellent forward drop characteristics, and was perfect in all respects.

On testing numerous rectifier units prepared in accordance with the present invention, the forward drop for units comprising one-quarter inch diameter silicon wafers varied from 0.7 to 0.81 volts for direct current outputs of up to 30 amperes, at voltages as high as 300 volts. In several tests the completed rectifier units were heated on a hot plate from room temperature to 250° C. to 300° C. and cooled back to room temperature a number of times and then tested for their rectifier characteristics. There was no appreciable change in the forward drop even after 12 such cycles. In other cases the same units were subjected to a temperature cycling test where they were cooled to −60° C. and then rapidly heated in an air oven to 200° C. No observable change in the forward drop was observed.

It will be understood that the above description and drawing are illustrative and not limiting.

I claim as my invention:

1. In a semiconductor device, in combination, an end contact member comprising a metal of the group consisting of molybdenum, tungsten and base alloys thereof having a coefficient of thermal expansion corresponding closely to that of silicon, a wafer of silicon having one surface conforming to a surface of the end contact member, the two surfaces being in juxtaposition, and a solder disposed between and bonding the silicon wafer to the end contact member, the solder comprising a silver alloy composed of from 0.5% to 8% by weight of antimony, at least 72% by weight of silver and the balance comprising at least one element from the group consisting of germanium, silicon, lead and tin.

2. In a semiconductor device, in combination, an end contact member comprising a metal of the group consisting of molybdenum tungsten and base alloys thereof having a coefficient of thermal expansion corresponding closely to that of silicon, a wafer of silicon having one surface conforming to a surface of the end contact member, the two surfaces being in juxtaposition, and a solder disposed between and bonding the silicon wafer to the end contact member, the solder comprising a silver alloy composed of from 0.5% to 8% by weight of antimony, at least 72% by weight of silver and the balance comprising at least one element from the group consisting of germanium, silicon, lead and tin, the end contact member being coated with a thin film of an alloy comprising from 10% to 35% by weight of cobalt, 33% to 22% by weight of nickel and the balance iron.

3. In a semiconductor rectifier, in combination, an end contact member comprising a metal of the group consisting of molybdenum, tungsten and base alloys thereof having a coefficient of thermal expansion corresponding closely to that of silicon, a wafer of silicon having one surface conforming to a surface of the end contact member, the two surfaces being in juxtaposition, and a solder disposed between and bonding the silicon wafer to the end contact member, the solder comprising a silver alloy composed of from 0.5% to 8% by weight of antimony, at least 72% by weight of silver and the balance comprising at least one element from the group consisting of germanium, silicon, lead and tin, and a second contact member of the metal employed for the end contact member bonded to another surface of the silicon wafer.

4. A semiconductor diode comprising, in combination, an end contact member with at least one flat surface and composed of a metal selected from the group consisting of molybdenum, tungsten and base alloys thereof having a coefficient of thermal expansion corresponding closely to that of silicon, a wafer of silicon having N-type conductivity and having two flat surfaces, superimposed on the flat surface of the end contact member, a fused layer disposed between and bonded to the flat superimposed surfaces of the end contact member and the silicon wafer, the fused layer consisting of an alloy of at least 72% by weight of silver, and from 0.5% to 8% by weight of antimony, and at least one element selected from the group consisting of tin, silicon, germanium and lead, a second contact member of the same metal as the end contact member, the second contact member having a flat surface, a layer of a P-type material interposed between the second contact member and the other flat surface of the silicon wafer, the layer of P-type material disposed bonding the second contact member to the silicon wafer, the thin layer of P-type material selected from the group consisting of aluminum and alloys of aluminum with at least one element selected from the group consisting of silicon, germanium, gallium, and indium, the P-type material diffused into the silicon to convert the adjacent silicon to the P-type thereby providing a P-N junction.

5. A semiconductor rectifier diode comprising, in combination, a flat end contact member of molybdenum, a thin fragile flat wafer of silicon having N-type conductivity superposed on the end contact member, a fused layer disposed between and bonding the silicon to the molybdenum, the fused layer composed of an alloy of more than 72% by weight of silver, from 0.5% to 8% by weight of antimony, up to 5% by weight of lead, and up to 10% by weight of dissolved silicon, a second contact member with a flat surface superimposed on the silicon wafer, a thin layer of fused aluminum material selected from the group consisting of aluminum and alloys of aluminum with at least one element selected from the group consisting of silicon, germanium, indium and gallium disposed between and bonding the silicon wafer to the second contact member, the aluminum material from the fused thin layer penetrating into and producing an adjacent layer in the silicon with P-type conductivity.

6. In the process of producing a semiconductor device, the steps comprising heating to a maximum temperature of between 800° C. and 1000° C. in a vacuum a superimposed stacked assembly of (1) an end contact member composed of an alloy of molybdenum, tungsten and base alloys thereof having a coefficient of thermal expansion corresponding closely to that of silicon, (2) a thin layer of a thickness of the order of from 1 to 6 mils of an alloy composed of from 0.5% to 8% by weight of antimony, up to 20% by weight of at least one element selected from the group consisting of silicon, germanium, lead and tin, and the balance comprising silver, (3) a wafer of a thickness of the order of from 5 to 10 mils of N-type silcon, (4) a thin layer of a thickness not exceeding 3 mils of aluminum material selected from the group consisting of aluminum and alloys of aluminum with at least one element selected from the group consisting of silicon, germanium, indium and gallium, capable of conferring P-type conductivity to silicon, and (5) another contact of the same metal as the end contact, the stacked assembly being under a light pressure, whereby the thin layer of silver alloy fuses and the thin layer of aluminum material fuses and wets the upper contact and the silicon wafer, and diffuses into the silicon wafer to convert the adjacent portions of silicon into P-type silicon, and then cooling the assembly, thereby producing a bonded unitary semiconductor member having a P-N junction.

7. The process of claim 6 wherein the end contact member is clad with nickel before being put into the stacked assembly.

8. In the process of preparing semiconductor members, the steps comprising heating to a temperature of between 850° C. and 1000° C. in a vacuum, a stacked assembly comprising (1) an end contact member of a metal from the group consisting of molybdenum, tungsten and base alloys thereof having a coefficient of thermal expansion corresponding closely to that of silicon, (2) a thin layer of a thickness of the order of from 1 to 6 mils of a silver base alloy composed of from 0.5% to 8% by weight of antimony, up to 20% by weight of at least one metal selected from the group consisting of silicon, germanium, lead and tin, and the balance being silver, and (3) a wafer of a thickness of the order of from 5 to 10 mils of N-type silicon, a pressure of the order of from 20 to 500 grams per square inch of silicon being applied to the stack, cooling the assembly to a temperature substantially below the melting point of the silver base alloy, then placing on the silicon wafer an aluminum member and a second contact member of the same metal as the end contact member, the aluminum member being of a metal selected from the group consisting of aluminum and alloys of aluminum with silicon, germanium, indium and gallium capable of conferring P-type conductivity to the silicon, heating this last assembly while being maintained under a light pressure of from 20 to 500 grams per square inch of area of the second contact member, the temperature during this last heating not exceeding 850° C., and cooling to room temperature.

9. The process of claim 8 wherein the end contact member is coated, previously to preparing the assembly, with an alloy composed of from 10% to 35% by weight of cobalt, from 33% to 22% by weight of nickel and the balance iron.

References Cited in the file of this patent

UNITED STATES PATENTS 2,702,360 Giacoletto ------------- Feb. 15, 1955